(12) United States Patent
Chan et al.

(10) Patent No.: US 6,965,264 B1
(45) Date of Patent: Nov. 15, 2005

(54) ADAPTIVE THRESHOLD SCALING CIRCUIT

(75) Inventors: Wai Cheong Chan, Sunnyvale, CA (US); Hon Kin Chiu, Hayward, CA (US)

(73) Assignee: National Semiconductor Corporation, Santa Clara, CA (US)

(*) Notice: Subject to any disclaimer, the term of this patent is extended or adjusted under 35 U.S.C. 154(b) by 140 days.

(21) Appl. No.: 10/611,396

(22) Filed: Jun. 30, 2003

(51) Int. Cl.[7] .............................................. G05F 3/02
(52) U.S. Cl. ...................................... 327/537; 327/534
(58) Field of Search ................................ 327/534, 536, 327/537

(56) References Cited

U.S. PATENT DOCUMENTS

| | | | | |
|---|---|---|---|---|
| 4,769,784 A | * | 9/1988 | Doluca et al. ............... | 327/537 |
| 5,929,693 A | * | 7/1999 | Kuroda ........................ | 327/535 |
| 6,166,577 A | * | 12/2000 | Mizuno et al. ............. | 327/278 |
| 6,285,622 B1 | * | 9/2001 | Haraguchi et al. .......... | 327/537 |
| 6,373,323 B2 | * | 4/2002 | Kuroda ........................ | 327/536 |
| 6,373,325 B1 | * | 4/2002 | Kuriyama .................... | 327/536 |
| 6,489,833 B1 | * | 12/2002 | Miyazaki et al. ............ | 327/534 |
| 6,590,440 B1 | * | 7/2003 | Williams et al. ............ | 327/396 |
| 6,608,517 B1 | * | 8/2003 | Chow et al. ................. | 327/365 |
| 2003/0080802 A1 | * | 5/2003 | Ono et al. .................... | 327/534 |
| 2004/0070440 A1 | * | 4/2004 | Tang et al. .................. | 327/534 |

* cited by examiner

*Primary Examiner*—Terry D. Cunningham
(74) *Attorney, Agent, or Firm*—Darby & Darby PC; John W. Branch

(57) ABSTRACT

The invention is directed to improving power consumption in an integrated circuit by reducing the leakage current of a plurality of MOS transistors with an adaptive back biasing circuit. Since the leakage current characteristic is often non-linear, the optimal back bias voltage (lowest leakage current) is typically identifiable at an inflection point in a graph of the leakage current characteristic versus back bias voltage. Also, depending upon the doping of the MOS transistors (N versus P type) and manufacturing variables for a particular fabrication process, the position of this inflection point can vary between individual integrated circuits that implement substantially the same arrangement of MOS transistors. Despite these issues, the inventive circuit can substantially reduce the leakage current by coupling an adjusted back bias voltage to the substrate of an Integrated Circuit. The invention provides an adjusted back bias voltage to the bulk terminals (substrate) based on a determination of the inflection point for the leakage current characteristic in an individual integrated circuit.

14 Claims, 4 Drawing Sheets

ADAPTIVE THRESHOLD SCALING CIRCUIT

FIELD OF THE INVENTION

The invention is generally directed to power management in an integrated circuit, and more particularly, the invention is directed to improving power consumption by back biasing the bulk terminals in an integrated circuit.

BACKGROUND OF THE INVENTION

Many complex circuits such as System on a Chip (SoC) solutions, and the like, have been designed for fabrication with deep sub-micron processes that enable millions of MOS transistors to be included in a single Integrated Circuit. However, as the number of transistors increases and the fabrication processes become ever more complex, the amount of power that is lost due to the Integrated Circuit's leakage current is becoming more of a concern.

Additionally, for a battery powered mobile device that includes at least one integrated circuit with a million or more transistors fabricated with a deep sub-micron process, the amount of power that is lost due to the leakage current can deplete the energy reserves of the battery even though the mobile device is in a relatively idle state. Typical mobile devices that might experience such an issue include mobile telephones, PDAs, portable notebooks, and the like.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION OF THE PREFERRED EMBODIMENT

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. The following detailed description is, therefore, not to be taken in a limiting sense.

Throughout the specification, the term "connected" means a direct connection between the things that are connected, without any intermediary devices or components. The term "coupled," means a direct connection between the things that are connected, or an indirect connection through one or more either passive or active intermediary devices or components. The meaning of "a," "an," and "the" include plural references. The meaning of "in" includes "in" and "on."

Briefly stated, the present invention is directed to an apparatus for improving power consumption in an integrated circuit by reducing the leakage current of a plurality of MOS transistors with an adaptive back biasing circuit. Since the leakage current characteristic is often non-linear, the optimal back bias voltage (lowest leakage current) is typically identifiable at an inflection point in a graph of the leakage current characteristic versus back bias voltage. Also, depending upon the doping of the MOS transistors (N versus P type) and manufacturing variables for a particular fabrication process, the position of this inflection point can vary between individual integrated circuits that implement substantially the same arrangement of MOS transistors. Despite these issues, the inventive circuit can substantially reduce the leakage current by coupling an adjusted back bias voltage to the substrate of an Integrated Circuit. The invention provides an adjusted back bias voltage to the bulk terminals (substrate) based on a determination of the inflection point for the leakage current characteristic in an individual integrated circuit.

Figure 1:
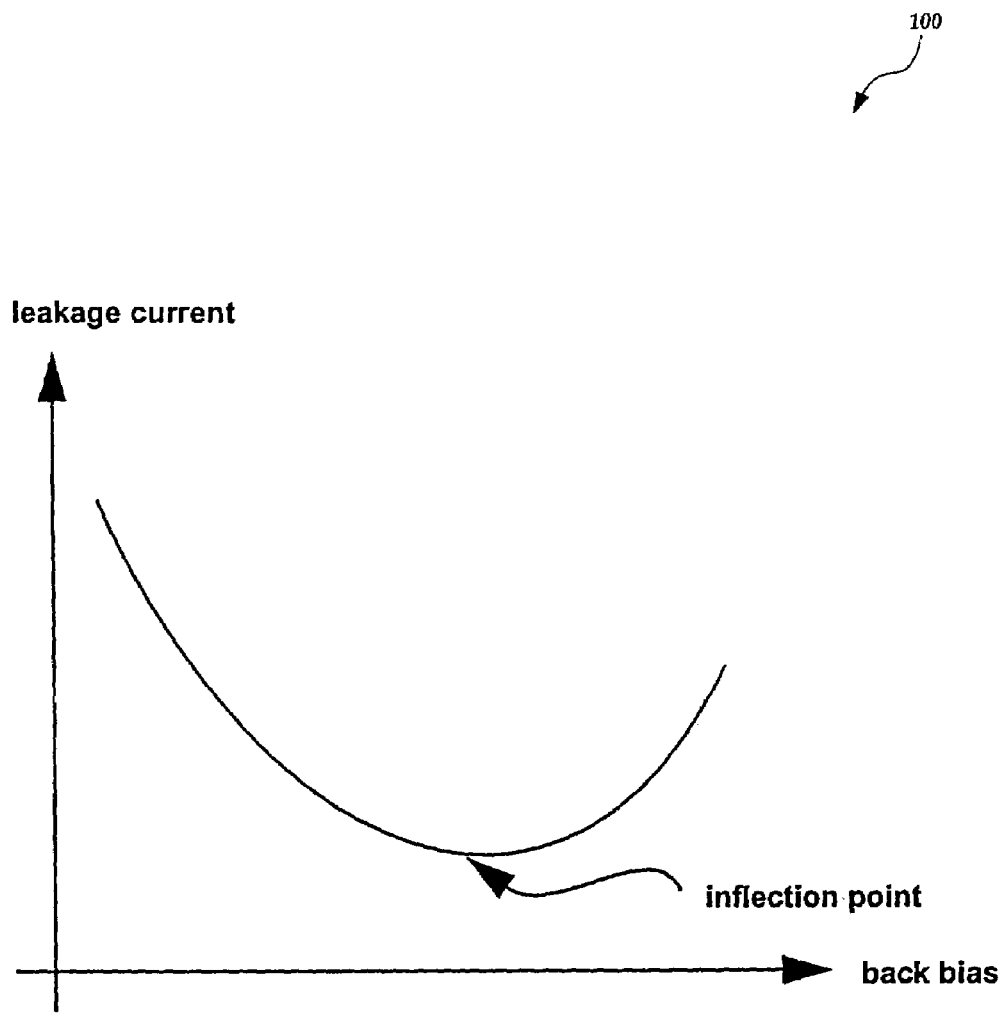
FIG. 1 illustrates a graph of a leakage current versus a back bias voltage.

FIG. 1 illustrates a graph of the leakage current characteristic versus back bias voltage with an inflection point showing the lowest leakage current at the some optimal value for the back bias voltage. Although not shown, other types of fabrication processes and different types of doping for MOS transistors in an integrated circuit can generate a graph with a substantially different shape and in some cases without a clearly identifiable inflection point. However, for exemplary purposes this invention is shown used with an integrated circuit that is fabricated with a process that enables the determination of an inflection point for the leakage current characteristic.

Figure 2:
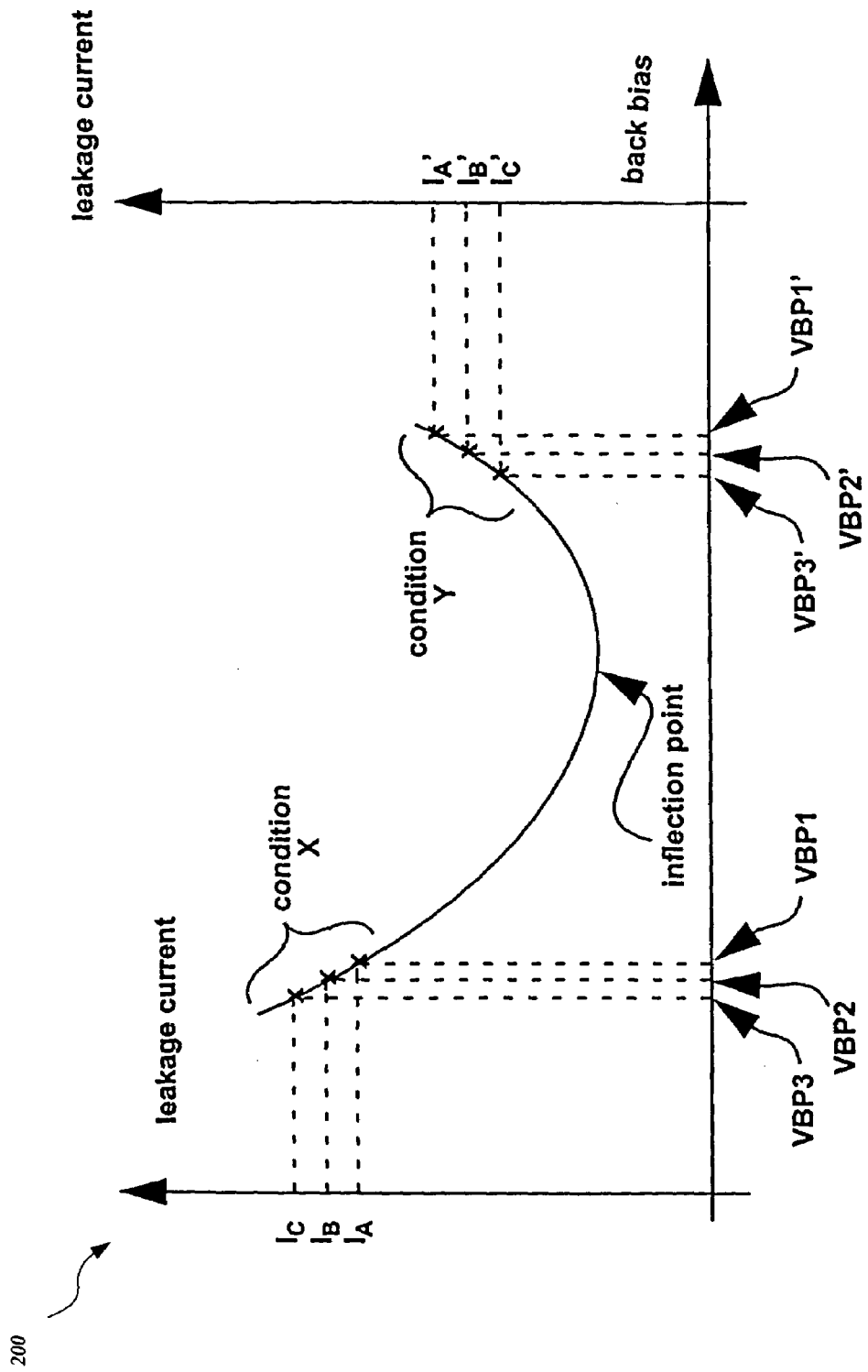
FIG. 2 shows a graph of leakage currents versus different back bias conditions.
Figure 3:
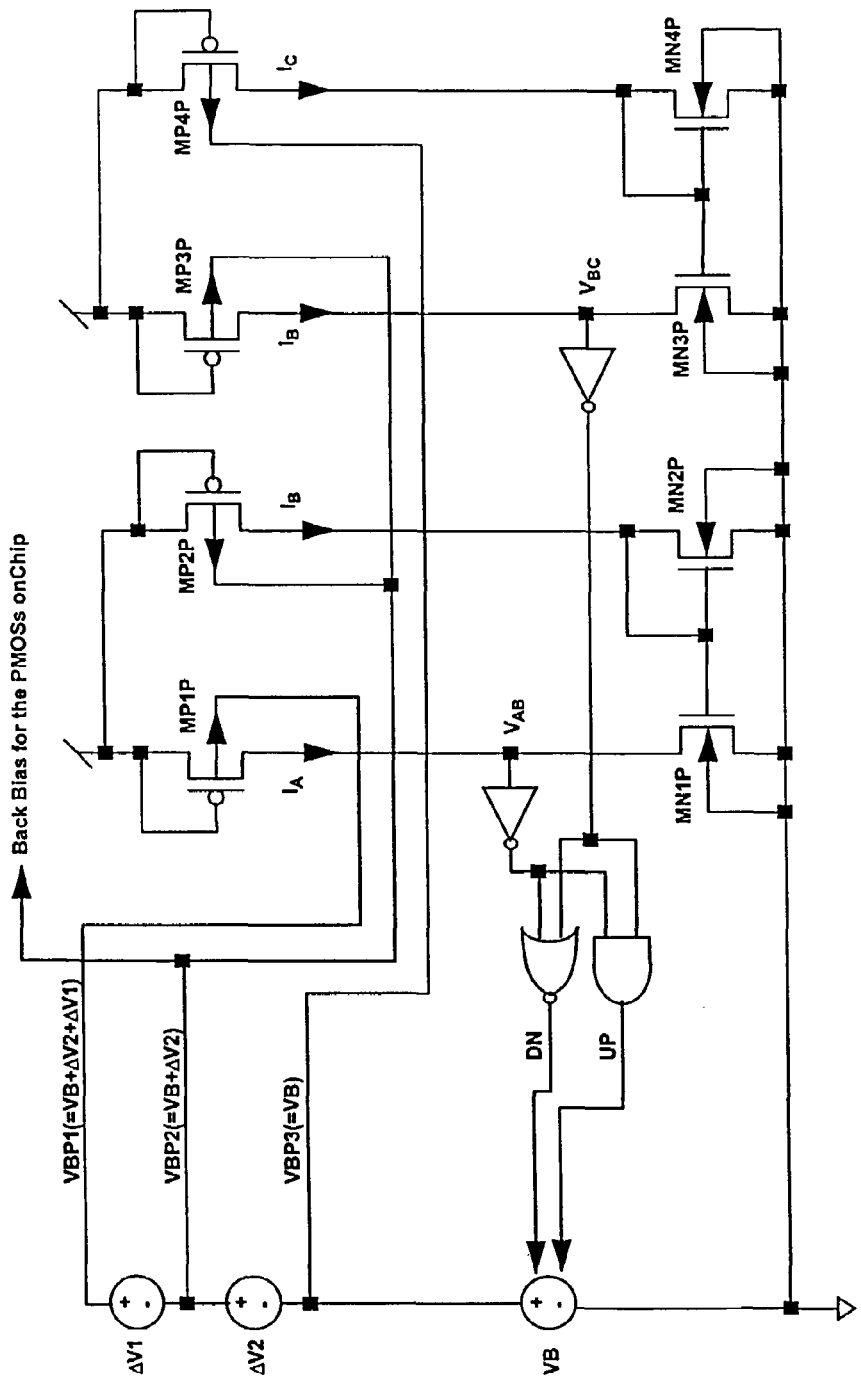
FIG. 3 illustrates a schematic diagram of a circuit for providing an optimal back bias voltage for PMOS transistors in an Integrated Circuit.

FIG. 2 shows a graph of the leakage current versus the back bias voltage in substantially the same manner as illustrated in FIG. 1. However, FIG. 2 show a parabolic shape opening upwards with an inflection point disposed between a Condition X and a Condition Y. Values for three leakage currents (IA, IB, IC) correspond to three back bias voltages (VBP1, VBP2, VBP3, which are associated with three MOS transistors as shown in FIG. 3) for the Condition X where the value of IC is greater than IB which is greater than IA. Also, values for substantially the same leakage currents (IA', IB', IC') for condition Y are plotted where the value of IA' is greater than IB' which is greater than IC'. As shown, the optimal back bias voltage lies at the inflection point between Condition X and Condition Y. Thus, by determining which condition (X or Y) is valid for a particular Integrated Circuit, the invention can "home in" on an adjusted back bias voltage that causes a relatively optimal reduction in the leakage current.

In FIG. 3, MP1P, MP2P, MP3P, MP4P are matched PMOS transistors and they are sized to provide a sufficiently detectable leakage current for the operation of the invention. Typically, these PMOS transistors are sized somewhat larger than the minimum size possible in the Integrated Circuit. As, shown the source and gate terminals of the PMOS transistors are tied to a high voltage in the Integrated Circuit. Also, the exemplary circuit shown in FIG. 3 is arranged to provide an adjusted back bias voltage to a plurality of PMOS transistors in the integrated circuit.

Also, in FIG. 3, NMOS transistors MN1P and MN2P are arranged as a current mirror and coupled to the drain terminals of MP1P and MP2P. Similarly, NMOS transistors MN3P and MN4P are arranged as another current mirror and coupled to the drain terminals of MP3P and MP4P. All of the source and substrate terminals for MN1P, MN2P, MN3P, and MN4P, are coupled to ground in the Integrated Circuit.

A bias voltage supply (VB) is coupled between ground and the low side of a voltage supply $\Delta V2$ where the low side of $\Delta V2$ and the high side of VB are coupled to the bulk terminal of MP4P and whose potential is represented as VBP3. The high side of $\Delta V2$ is coupled to the low side of voltage supply $\Delta V1$ where the low side of $\Delta V1$ is coupled to the bulk terminals of MP2P and MP3P which is where the adaptive back bias voltage of VBP2 (VB+$\Delta V2$) is generated for the PMOS transistors in the Integrated Circuit. Additionally, the high side of $\Delta V1$ is coupled to the bulk terminal of MP1P and whose potential is represented as VBP1 (VB+$\Delta V2$+$\Delta V1$).

In FIG. 3, the leakage current IC flows from MP4P into the drain terminal of MN4P and the leakage current IB flows from MP3P into the drain terminal of MN3P. The leakage current IA flows from the MP1P into the drain terminal of MN1P and another leakage current IB flows from the MP2P into the drain terminal of MN2P (this other IB is complementary and substantially equal to the IB flowing from MP3P).

An input of an inverter is coupled between the drain terminal of MP1P and the drain terminal of MN1P so that a voltage at node VAB represents the difference in magnitude between the leakage currents IA and IB. The output of the inverter is coupled to an input of a NOR logic component and an input of an AND logic component. Similarly, an input of another inverter is coupled between the drain terminal of MP3P and the drain terminal of MN3P so that a voltage at a node VBC represents the difference in magnitude between the leakage currents IB and IC. The output of the other inverter is coupled to an input of the NOR component and an input of the AND component.

The output of the NOR component is coupled to voltage supply VB and when high, the NOR's output will cause VB to increase its voltage. Similarly, the output of the AND component is coupled to voltage supply VB and when high, the AND output causes VB to decrease its voltage. When neither output of the AND and NOR components are high, voltage supply VB outputs a relatively constant voltage.

In operation, leakage current IA is compared to leakage current IB using MP1P and MP2P through the current mirror formed by MN1P and MN2P. Similarly, leakage current IC is compared to leakage current IB using MP4P and MP3P through the current mirror formed by MN4P and MN3P. If IB is larger than IA, the voltage at node VAB will go low; else it will go high. Similarly, if IC is larger than IB, the voltage at node VBC will go low; else it will be high. The UP and DOWN signals are generated by the AND and NOR logic components, respectively, in response to the high and/or low voltages at nodes VAB and VBC.

Also, if IB is less than IC and IA is less than IB, then the back bias condition is to the left of the inflection point (Condition X in FIG. 2). If however, IA is larger than IB, IB is larger than IC, then the back bias condition is to the right of the inflection point (Condition Y in FIG. 2).

In Condition X, the back bias voltage is too low (See FIG. 2) and the leakage current IC is greater than IB which is greater than IA. Because the voltages at nodes VBC and VAB are low, both of the inverters will output a high signal which will cause the output of the AND component to go high and the output of the NOR component to go low. Since the output of the AND component is high, the voltage supply VB will start increasing its voltage until the output of the AND component goes low. The AND component output goes low after the voltage for voltage supply VB has increased enough to cause one of the inverters to output a low signal. In this way, back bias voltage VBP2 is at, or close to, the inflection point for the lowest leakage current (See FIG. 2) and banded between the voltages VBP1 and VBP3.

In a substantially similar manner, for Condition Y, the back bias voltage is too high (See FIG. 3) and the leakage current IA' is greater than IB' which is greater than IC'. Because voltages VBC and VAB are both high, the inverters will output low signals causing the AND component to output a low signal and the NOR component to output a high signal. Voltage supply VB will start decreasing its voltage until the output of the NOR component is low. The NOR component output goes low after the voltage supply VB has decreased its voltage enough to cause one of the inverters to output a high signal. In this way, back bias voltage VBP2 is at, or close to, the inflection point for the lowest leakage current (See FIG. 2) and banded between the voltages VBP1 and VBP3.

Figure 4:
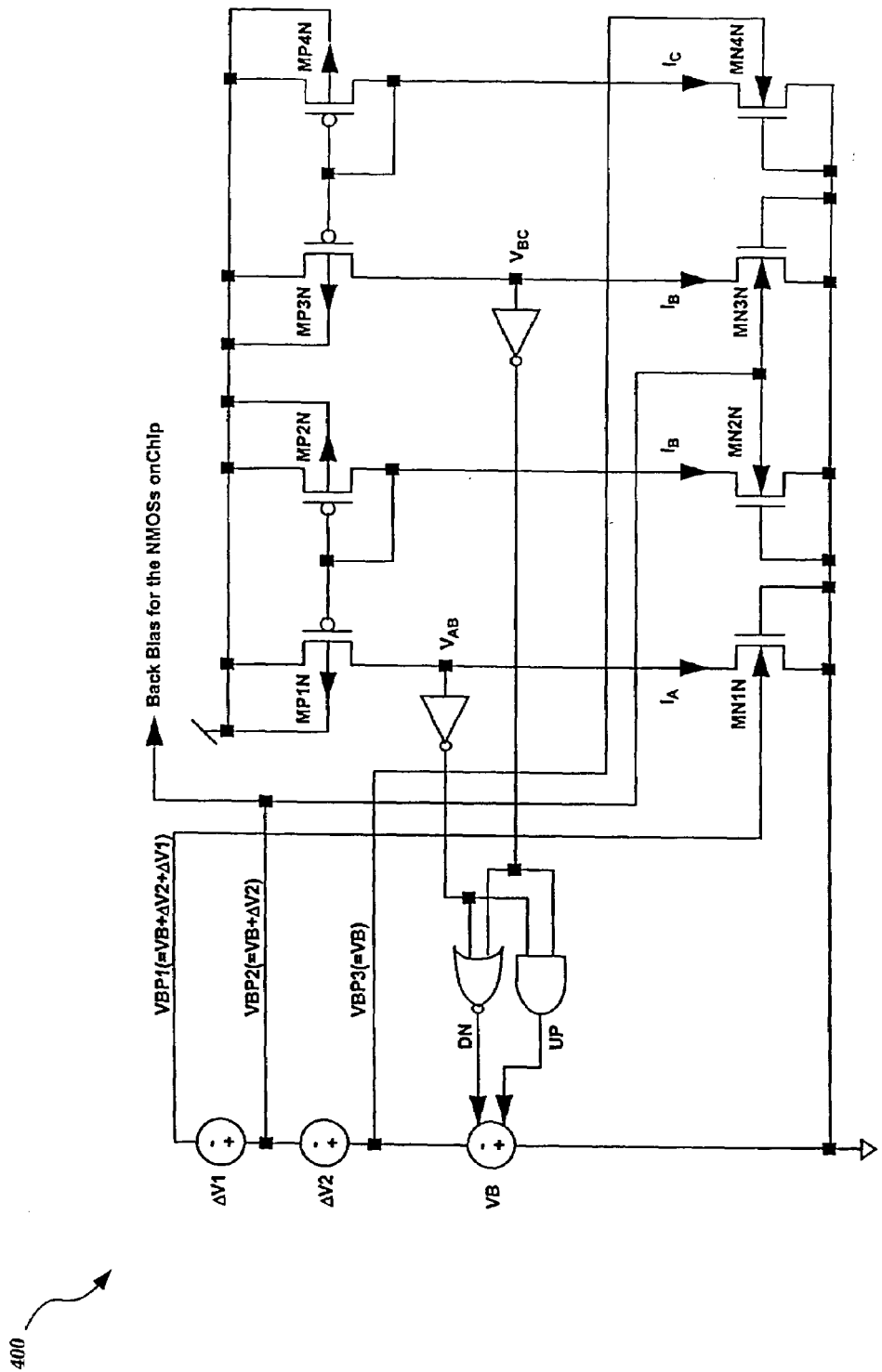
FIG. 4 shows a schematic diagram of a circuit for providing an optimal back bias voltage for NMOS transistors in an integrated circuit, in accordance with the invention.

Additionally, where FIG. 3 showed an inventive circuit for generating an adaptive back bias voltage for use with PMOS transistors in an integrated circuit, FIG. 4 illustrates employing the invention with NMOS transistors. Although the polarity of some of the operational characteristics are different and the arrangement of NMOS and PMOS transistors is switched, it is understood that the inventive circuit shown in FIG. 4 operates in substantially the same manner as the circuit shown in FIG. 3 with substantially the same benefits.

It is understood that the range of leakage current reduction that can be realized with this invention might be on the order of a magnitude depending on the number of transistors and the type of fabrication process that is employed. Although not intended to be limiting in any sense, in some cases, the leakage current can be reduced to about eight microamps.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for reducing a leakage current for a plurality of MOS transistors disposed in an integrated circuit, comprising:
   a detection circuit for automatically generating an up signal and a down signal based on a determination as to what side of an inflection point that an initial value of the leakage current is disposed, wherein the inflection point is a graphical representation of a value for a back bias voltage that causes the least amount of leakage current from the plurality of MOS transistors, and wherein the detection circuit further includes at least two current mirrors that are arranged with complementary MOS transistors that have a relatively matched size; and
   a bias circuit for automatically providing an adjusted back bias voltage that enables the least amount of leakage current by the plurality of MOS transistors, wherein if the up signal is generated, then the adjusted back bias voltage is increased and if the down signal is generated, then the adjusted back bias voltage is decreased, and wherein the biasing circuit provides a relatively constant value for the back bias voltage if both the up signal and the down signal are ungenerated by the detection circuit.

2. The apparatus of claim 1, wherein the plurality of MOS transistors are PMOS transistors, wherein if the initial leakage current is disposed before the inflection point, the up signal is generated and the adjusted back bias voltage is increased, and wherein if the initial leakage current is disposed after the inflection point, the down signal is generated and the adjusted back bias voltage is decreased.

3. The apparatus of claim 1, wherein the plurality of MOS transistors are NMOS transistors.

4. The apparatus of claim 1, wherein the detection circuit further includes a logic circuit that activates the biasing circuit with up and down signals that are based on a comparison of at least three voltages generated by at least three leakage currents in at least two pairs of MOS transistors of a relatively matched size, wherein the matched pairs of MOS transistors are coupled to separate current mirrors that are arranged with complementary MOS transistors that have a relatively matched size.

5. The apparatus of claim 1, wherein the detection circuit further includes a logic circuit that employs at least three voltages to band the position of the inflection point, wherein the at least three voltages are generated by at least three leakage currents in at least two pairs of MOS transistors of a relatively matched size, wherein the matched pairs of MOS transistors are coupled to separate current mirrors that are arranged with complementary MOS transistors that have a relatively matched size.

6. The apparatus of claim 1, wherein the detection circuit further includes at least two pairs of MOS transistors of a relatively matched size, wherein the matched pairs of the MOS transistors are sized substantially larger than a minimum size for the plurality of MOS transistors, and wherein the substantially larger size of the matched MOS transistors enables the initial leakage current to be detectable by the detection circuit.

7. The apparatus of claim 1, wherein the back bias voltage is coupled to a substrate shared by the bulk terminals for the plurality of MOS transistors.

8. The apparatus of claim 1, wherein the back bias voltage is a reverse bias voltage applied to a bulk terminal of the plurality of MOS transistors.

9. The apparatus of claim 1, further comprising a battery that supplies power to the integrated circuit, wherein the reduction in the value of the leakage current causes a decrease in the amount of power drawn in an idle state by the integrated circuit from the battery.

10. An integrated circuit that reduces a leakage current for a plurality of PMOS transistors disposed in an integrated circuit, comprising:
a detection circuit for automatically determining on what side of an inflection point that an initial value of the leakage current is disposed, wherein the inflection point is graphical representation of a value for a back bias voltage that causes a least amount of leakage current from the plurality of PMOS transistors, wherein if the initial value of the leakage current is disposed before the inflection point, an up signal is generated, and wherein if the initial leakage current is disposed after the inflection point, a down signal is generated; and wherein the PMOS transistors in the detection circuit are of a relatively matched size that is substantially larger than a minimum size for the plurality of PMOS transistors and wherein the substantially larger and matched size of the PMOS transistors in the detection circuit enables the initial leakage current to be detectable by the detection circuit; and
a bias circuit for automatically providing a back bias voltage that enables the least amount of leakage current by the plurality of PMOS transistors, wherein if an up signal is generated, then the magnitude of the back bias voltage is increased and if a down signal is generated, then the magnitude of the back bias voltage is decreased, and wherein the biasing circuit provides a relatively constant value for the back bias voltage if both the up signal and the down signal are ungenerated by the detection circuit.

11. The integrated circuit of claim 10, wherein the integrated circuit is fabricated with a sub-micron process.

12. The integrated circuit of claim 11, wherein the detection circuit further includes a logic circuit that activates the biasing circuit with up and down signals that are based on a comparison of at least three voltages that are adjusted to band the position of the inflection point, wherein the middle voltage is selected for the adjusted back bias voltage.

13. The integrated circuit of claim 10, wherein the back bias voltage is a reverse bias voltage that is applied to a bulk terminal of the plurality of PMOS transistors.

14. An integrated circuit that reduces a leakage current for a plurality of NMOS transistors disposed in an integrated circuit, comprising:
a detection circuit for automatically determining on what side of an inflection point that an initial value of the leakage current is disposed, wherein the inflection point is graphical representation of a value for a back bias voltage that causes a least amount of leakage current from the plurality of NMOS transistors, wherein if the initial value of the leakage current is disposed before the inflection point, an up signal is generated, and wherein if the initial leakage current is disposed after the inflection point, a down signal is generated; and wherein the NMOS transistors in the detection circuit are of a relatively matched size that is substantially larger than a minimum size for the plurality of NMOS transistors, and wherein the substantially larger and matched size of the NMOS transistors in the detection circuit enables the initial leakage current to be detectable by the detection circuit; and
a bias circuit for automatically providing a back bias voltage that enables the least amount of leakage current by the plurality of NMOS transistors, wherein if an up signal is generated, then the magnitude of the back bias voltage is decreased and if a down signal is generated, then the magnitude of the back bias voltage is increased, and wherein the biasing circuit provides a relatively constant value for the back bias voltage if both the up signal and the down signal are ungenerated by the detection circuit.

* * * * *

UNITED STATES PATENT AND TRADEMARK OFFICE
CERTIFICATE OF CORRECTION

PATENT NO. : 6,965,264 B1
DATED : November 15, 2005
INVENTOR(S) : Wai Cheong Chan et al.

It is certified that error appears in the above-identified patent and that said Letters Patent is hereby corrected as shown below:

<u>Title page,</u>
Item [54], Title, delete "ADAPTIVE THRESHOLD SCALING CIRCUIT" and substitute -- ADAPTIVE THRESHOLD SCALING --.

<u>Column 6,</u>
Line 7, after "transistors" insert -- , --.
Line 23, delete "claim 11", and insert -- claim 10, --.

Signed and Sealed this

Twenty-fifth Day of April, 2006

JON W. DUDAS
*Director of the United States Patent and Trademark Office*